US005644530A

United States Patent [19]
Gaultier

[11] Patent Number: 5,644,530
[45] Date of Patent: Jul. 1, 1997

[54] ELECTRICALLY MODIFIABLE NON-VOLATILE MEMORY INCORPORATING TEST FUNCTIONS

[75] Inventor: Jean-Marie Bernard Gaultier, Rousset, France

[73] Assignee: SGS-Thomson Microelectronics, S.A., Gentilly, France

[21] Appl. No.: 418,636

[22] Filed: Apr. 7, 1995

[30] Foreign Application Priority Data

Apr. 8, 1994 [FR] France .................................. 94 04565

[51] Int. Cl.$^6$ .......................... G11C 16/06; G01R 31/28
[52] U.S. Cl. ............................... 365/185.09; 365/185.29; 365/201; 371/21.3
[58] Field of Search ..................... 365/185.09, 185.12, 365/201, 185.29; 371/21.1, 21.2, 21.3

[56] References Cited

U.S. PATENT DOCUMENTS

| | | |
|---|---|---|
| 4,024,386 | 5/1977 | Caudel et al. .......................... 371/21.1 |
| 4,430,735 | 2/1984 | Catiller .................................... 371/21.2 |
| 4,672,583 | 6/1987 | Nakaizumi .............................. 365/201 |
| 4,744,058 | 5/1988 | Kawashima et al. ................... 371/21.3 |
| 4,872,168 | 10/1989 | Aadsen et al. .......................... 371/21.3 |

FOREIGN PATENT DOCUMENTS 0548866  6/1993  European Pat. Off. .

*Primary Examiner*—Joseph A. Popek
*Attorney, Agent, or Firm*—Robert Groover; Betty Formby; Matthew Anderson

[57] ABSTRACT

The disclosed device can be used to accelerate the tests carried out on memories by using a row and column address generator normally designed for operations of pre-erasure programming of the memory. The working in test mode is determined by a test word. During a test, row and/or column counters of the generator are selectively incremented by an incrementation signal given by a control unit that performs a pre-erasure programming operation. Application notably to FLASH EEPROM memories and the integrated circuits that incorporate these memories.

10 Claims, 3 Drawing Sheets

ELECTRICALLY MODIFIABLE NON-VOLATILE MEMORY INCORPORATING TEST FUNCTIONS

CROSS-REFERENCE TO RELATED APPLICATION

This application claims priority from French App'n 94-04565, filed Apr. 8 1994, which is hereby incorporated by reference. However, the content of the present application is not necessarily identical to that of the priority application.

BACKGROUND AND SUMMARY OF THE INVENTION

The invention is located chiefly in the field of electrically modifiable non-volatile integrated circuit memories and relates more particularly to FLASH EEPROM type memories.

The methods used to manufacture integrated circuits very often cause defects. Hence, after manufacture, each integrated circuit is subjected to tests designed to detect the presence of such defects. Thus, in the case of non-volatile memories which, after manufacture, normally have all their memories cells erased, it is first of all ascertained that the memory array is blank by making a routine reading of all the addresses so as to ensure that each memory cell is truly erased. Write commands are then sent to specified addresses so as to program the corresponding cells. Then, the memory is re-read for these very same addresses and any divergence between the data elements that should have been written and the data elements read points to the existence of a defect.

For memories with large capacities, it is essential to reduce the testing time needed for the detection of defects and hence to achieve the optimal organization of the complete testing of the product, namely the testing of all the possible configurations of the programmed or erased states of the entire memory space. Since the memories are generally organized in a matrix formed by rows and columns of cells, it is possible to limit the number of configurations to be tested while at the same time having significant information on the integrity of the memory after each step of the test.

Thus, since the address of a cell (or of a set of cells forming a word) is formed by a row address and a column address corresponding respectively to the least significant bits and the most significant bits of the address, it is possible, for example, to verify that the row decoders are working properly by the successive programming of all the cells of the first row. To this end, the programming of the cells whose addresses have their most significant bits at zero is activated. These same addresses are then re-read and it is ascertained that the data elements read truly correspond to programmed cells. Similarly, it is possible to verify the column decoders by successively programming the cells whose addresses have their least significant bits at zero. It is also possible to verify the absence of interaction between the row decoders and column decoders by programming the diagonal of the matrix. Finally, to detect the possible interactions between the cells, all the cells whose addresses have most significant bits and least significant bits with the same parity are programmed so as to set up checkerboards of programmed cells. The procedure is ended by programming the cells in a complementary checkerboard pattern.

These few simple tests are a first step used for the speedy detection of frequently encountered defects.

Up till now, the testing operations such as those just described have been carried out by means of a tester connected to the external terminals of the integrated circuit to be tested. The tester is a unit programmed for the automatic generation of the addresses and data elements corresponding to the test profiles to be carried out and for the applying of the corresponding commands to the terminals of the circuit. The tester then activates the reading of the memory for the same addresses and compares the data elements that are read with the data elements that are written.

This method therefore implies a complete writing operation for each cell (or each word) to be programmed. The result thereof is that the time needed to carry out the complete testing of each memory is relatively lengthy especially if it is a large-capacity memory and if the communications protocol requires several cycles for each write command.

Thus, the invention is aimed at reducing the testing time by replacing the external write commands by automatic internal programming mechanisms.

To this end, an object of the invention is a non-volatile memory that is electrically modifiable by erasing and programming operations, said memory comprising:

at least one matrix of memory cells organized in rows and columns, supply means to apply erasure and programming voltages to said rows and columns, said programming voltages being applied selectively to the rows and columns identified respectively by row addresses and column addresses, an address generator comprising counting means activated by an incrementation signal, means to control said supply means and said address generator, said erasure operation consisting of the performance, by said control means, of a first pre-erasure programming algorithm followed by a second erasure algorithm, said first algorithm consisting in activating the incrementation of said counting means so that it successively gives all the possible values of said row addresses and column addresses and, for each address value given, in activating said supply means so that they give said programming voltages, said memory being one wherein said counting means comprise a row counter and a column counter respectively giving said row address and column address values, and wherein said address generator is designed to work according to a normal mode and at least one test mode, the operation in test mode(s) being conditioned by a first test word, said normal mode consisting in incrementing said row counter exclusively by said incrementation signal and said column counter exclusively by an overflow signal of said row counter, said test mode or modes consisting in permitting the incrementation, by said incrementation signal, of said row counter and/or the incrementation of said column counter as a function of said first test word.

Since the implementation of the test modes uses, to a large extent, means necessary in normal operation (such as the pre-erasure programming algorithm and the counting means), the invention furthermore has the advantage of entailing very little extra cost.

According to the invention, it is possible to provide for a first test mode to program the first row by incrementing solely the row counter or else a second test mode to program the first column by incrementing solely the column counter or else a third test mode to program the diagonal by incrementing the row and column counters simultaneously.

Certain memories have several matrices of memory cells each defining a sector that can be selected by a sector address. These memories are generally designed so that it is possible to achieve the selective erasure of any one of the sectors or all these sectors (total erasure). The counting means can then be broken down into a row counter, a column counter and a sector counter, the sector counter being designed to carry out the total erasure of the memory.

Thus, according to another aspect of the invention, a fourth test mode consists in simultaneously incrementing said row and column counters by said incrementation signal and in activating the incrementation of said sector counter by a signal relating to the overflow of said column counter.

In order to detect the interactions among several sectors, it is advantageously provided that the overflow signal of said column counter will activate the incrementation of said column counter when the address generator works according to said fourth test mode. This arrangement indeed makes it possible to shift the diagonals of programmed cells when going from one sector to the next one.

To enable the performance of other tests producing alternations of programmed and non-programmed cells of each matrix, the invention furthermore provides that the control means will comprise at least one data generator which can be placed in a first state or a second state and which, during the performance of said first algorithm, controls said supply means so that they apply said programming voltages provided that said data generator is in said first state, said data generator being designed to work according to a normal mode or at least one test mode, the operation in test mode being conditioned by a second test word, said operation in normal mode consisting in placing said data generator in said first state, the operation in test mode consisting in placing said data generator in said second state as a function of said second test word and addresses given by said data generator.

The presence of the data generator just defined makes it possible, especially, to obtain checkerboard type test modes. To this end, it is enough to make the address generator work according to its normal mode and place the data generator in its first state as a function of the respective parities of the values contained in the row and column counters. Thus, an even parity or odd parity checkerboard is obtained depending on whether the condition laid down is that the row and column address values should have the same parity or that they should have opposite parities.

An object of the invention is also an integrated circuit incorporating a memory having the characteristics that have just been explained. Advantageously, the integrated circuit will also contain a test circuit to give the test words in response to test commands external to the integrated circuit.

BRIEF DESCRIPTION OF THE DRAWING

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

Figure 1:
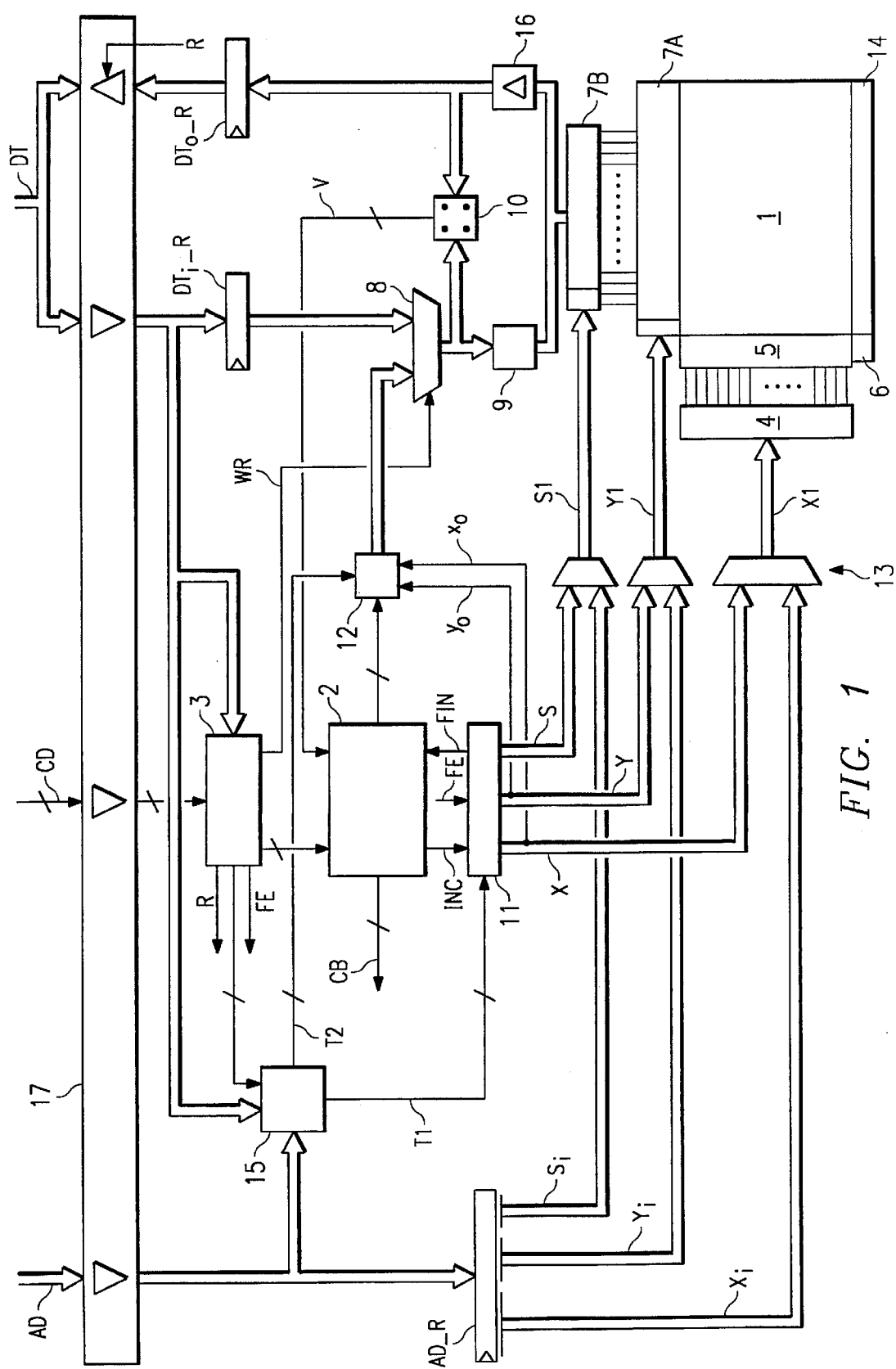
FIG. 1 is a general diagram of a memory according to the invention.

The numerous innovative teachings of the present application will be described with particular reference to the presently preferred embodiment (by way of example, and not of limitation), in which:

FIG. 1 shows the main constituent elements of a memory according to the invention. As a non-restrictive example, the memory shown is of the FLASH EEPROM type.

The memory is essentially constituted by a matrix 1 of memory cells organized in rows and columns, control means 2, 3, supply means, 6, 9, 14 to supply the rows and columns and reading means 16. Access is got to each cell (or word) of the matrix as a function of a current address formed by a row address X1, a column address Y1 and possibly a sector address S1 if the memory is formed by several independent matrices. The rows are selected by means of a row decoder 4 controlling a selection circuit 5. Similarly, the columns are selected by means of decoders and selection circuits of the columns 7A, 7B as a function respectively of the address of the column Y1 and the address of the sector S1. The addresses X1, Y1, S1 come either from an address register AD-R or from an address generator 11 by means of address selectors 13.

The memory communicates with the external address lines AD, control lines CD and data lines DT by means of an interface circuit 17. The data elements exchanged with the exterior by the lines DT go through an input data register DTi-R for the writing operations and an output data register DTo-R for the reading operations. A control circuit 3 receives external control and data signals respectively from the lines CD and DT. The function of the circuit 3 is to interpret these external signals in order to give internal commands such as R, FE, WR which condition the working of all the circuits. In particular, the circuit 3 works with a microprogrammed control unit 2 whose task essentially is to control the programming and erasure operations. The unit 2 is, for example, formed by programmable logic arrays (PLA) designed to carry out programming and erasure algorithms which shall be explained in greater detail in the rest of the description.

The unit 2 controls a data generator 12 whose output is connected to a first input of a data selector 8 whose second input is connected to the output of the input data register DTi-R. The output of the selector 8 is connected to the supply circuit of the columns 9 as well as to a first input of a comparator 10 whose second input is connected to the output of the reading means 16. The comparator 10 provides the unit 2 with comparison signals V.

A test circuit 15 controlled by the circuit 3 receives the data signals and external address signals to give, in particular, the test words T1, T2 applied respectively to the address generator 11 and to the data generator 12.

The memory is also provided with clock circuits to synchronize the working of the different elements, auxiliary supply circuits as well as reconfiguration circuits enabling the use of the redundant cells. These elements are not shown in the figure so as to avoid unnecessarily burdening it.

In order to describe the working of the circuit of FIG. 1, it may be useful to recall the particular features of FLASH EEPROM memories. This type of memory uses, as a memory cell, a particular floating-gate MOS transistor whose conduction threshold can be modified by the application, to its electrodes, of appropriate voltages. The programming of a cell consists in creating a high threshold (for example a threshold of 6 volts) by the application of programming voltages to the gate (for example 12 volts) and to the drain (for example 6 volts), the source being at the ground. This programming is selective and is controlled for each transistor of the memory. By convention, it shall be said that a programmed cell memorizes the logic 0 value. The erasure of a cell consists in creating a low threshold (for example 2 volts) by the application of an erasure voltage (for example 10 volts) to the source of the transistor, its gate being at the ground and its drain being placed in the high impedance state. Unlike the programming, an erasure operation is a total operation. This means that it is applied to all the cells of the memory or to all the cells of an entire sector if the memory is organized in several independent sectors. With the above convention, an erased cell memorizes the logic 1 value. The reading of a cell consists in detecting its conduction state. For this purpose, a reading voltage (for example 5 volts) is applied to its gate and the current flowing in the cell is compared with the current flowing in a reference cell.

When a write operation has to be done, i.e. when the programming of certain cells of the memory has to be modified, it is necessary first of all to erase the concerned sector. However, because of the total nature of the erasure, it is necessary beforehand to carry out a controlled programming of each cell of the sector considered so as to limit drifts and variations in the threshold values after total erasure. This pre-erasure programming is obtained by the performance of a specific algorithm which controls the addressing and controls the programming of each of the cells of the sector.

In normal operation mode, the memory is designed to carry out essentially the operations of reading, erasure by sectors, total erasure and writing. These operations are activated as a function of the external control signals and, possibly, as a function of associated external data. The memory is furthermore designed to work in one or more test modes determined also by the external signals present at the lines CD and DT. All these external signals are received and interpreted by the control circuit 3 giving the various control signals corresponding to the different elements implicated by the operation to be performed.

Thus, for a reading operation, the address received by the lines AD is transmitted to the inputs of the decoders 4, 7A, 7B by means of the address register AD-R and address selectors 13. The circuit 3 furthermore activates the row supply circuit 6 and the reading means 16. The circuit 6 thus applies a read voltage to the gates of the cells of the selected row as a function of the address X1. The means 16 have the function of supplying the drains of the cells selected by the row addresses Y1 and of comparing the currents thus produced with the current flowing in a reference cell. The result of these comparisons is loaded into the register DTo-R.

For a writing operation, the address is loaded into the register AD-R and the data to be written is loaded into the register DTi-R. The data selector 8 is positioned so that the register DTi-R controls the column supply circuit 9 so as to apply, as a function of the data element to be written, a programming voltage to the drains of the cells selected by the address Y1. At the same time, the units 2 activates the supply circuit 6 so as to apply a calibrated programming pulse to the gates of the transistors of the selected row as a function of the address X1. A reading operation is then done to compare the conduction state of the cells to be programmed with a programmed reference cell. Cases of divergence are reported to the unit 2 by the comparator 10 by means of the comparison signals V. In the event of divergence, the unit 2 again activates a programming pulse at the gates. Another reading and another comparison are then done to determine whether a new programming pulse is needed. This cycle is repeated so long as a difference is detected.

An operation for the erasure of the memory is done by the performance of two successive algorithms: a pre-erasure programming algorithm and an algorithm of erasure proper. The data selector 8 is positioned to enable the data generator 12 to control the column supply circuit 9. To perform the pre-erasure programming algorithm, the unit 2 activates the data generator 12 so that it gives, at output, the logic 0 value corresponding to the programmed state of the cell. In the event of an operation of total erasure of the memory, the address selectors 13 are positioned to transmit the internal addresses X, Y, S of the address generator 11 to the inputs of the row decoders 4 and column decoders 7A, 7B. The unit 3 then activates a programming cycle which first of all controls the supply circuit 6 to give a programming pulse at the gates. Then, as in the case of the writing operation, the data elements are read and compared to find out whether a new programming pulse is necessary. If so, a new programming cycle is carried out. The programming cycles are repeated in this way until the comparator 10 no longer detects any difference. The unit 2 then gives the address generator 11, which is initially at zero, an incrementation control signal INC so as to increase the internal address X, Y, S by one unit. The unit 2 then activates new programming cycles in the manner explained here above. At the end of these cycles, the internal address is again incremented. The operation is repeated until the address generator detects an address overflow reported to the unit 2 by an end-of-count signal FIN.

The pre-erasure programming algorithm for an erasure operation for a single sector of the memory is carried out identically, with the difference that only the least significant bits X and Y of the internal address are used to address the memory and to detect the address overflow.

The unit 2 then gets connected to the erasure algorithm which consists first of all in controlling the data generator 12 so that its gives, at output, the logic 1 value corresponding to the erased state of the cell. It then activates the sources supply circuit 14 so that it applies an erasure voltage. The algorithm continues with a succession of reading and comparison operations aimed at comparing the conduction state of the cells to be erased with an erased reference cell. In the event of a difference, the erasure voltage is once again applied to the sources and a new methodical verification of all the cells is again carried out. This cycle is repeated so long as a difference is detected by the comparator 10.

As already pointed out, an erasure operation may relate to a particular sector or to all the sectors of the memory. In the former case, the address generator signal FIN corresponds to the state of overflow of the row address Y. In the latter case, it corresponds to the overflow of the sector S address.

The working of the memory in test mode is conditioned by the reception of specific external commands detected by the control circuit 3 and processed by the test circuit 15. Depending on the command received, hence on the type of test to be carried out, the circuit 15 gives the test words T1 and T2 respectively applied to the address generator 11 and to the data generator 12. These test words T1, T2 have the effect of modifying the working of the generators 11 and 12. The performance of a test operation then consists simply in making the unit 2 carry out its pre-erasure programming algorithm. Details relating to modifications made in the generators 11 and 12 shall now be given with reference to FIGS. 2 and 3.

Figure 2:
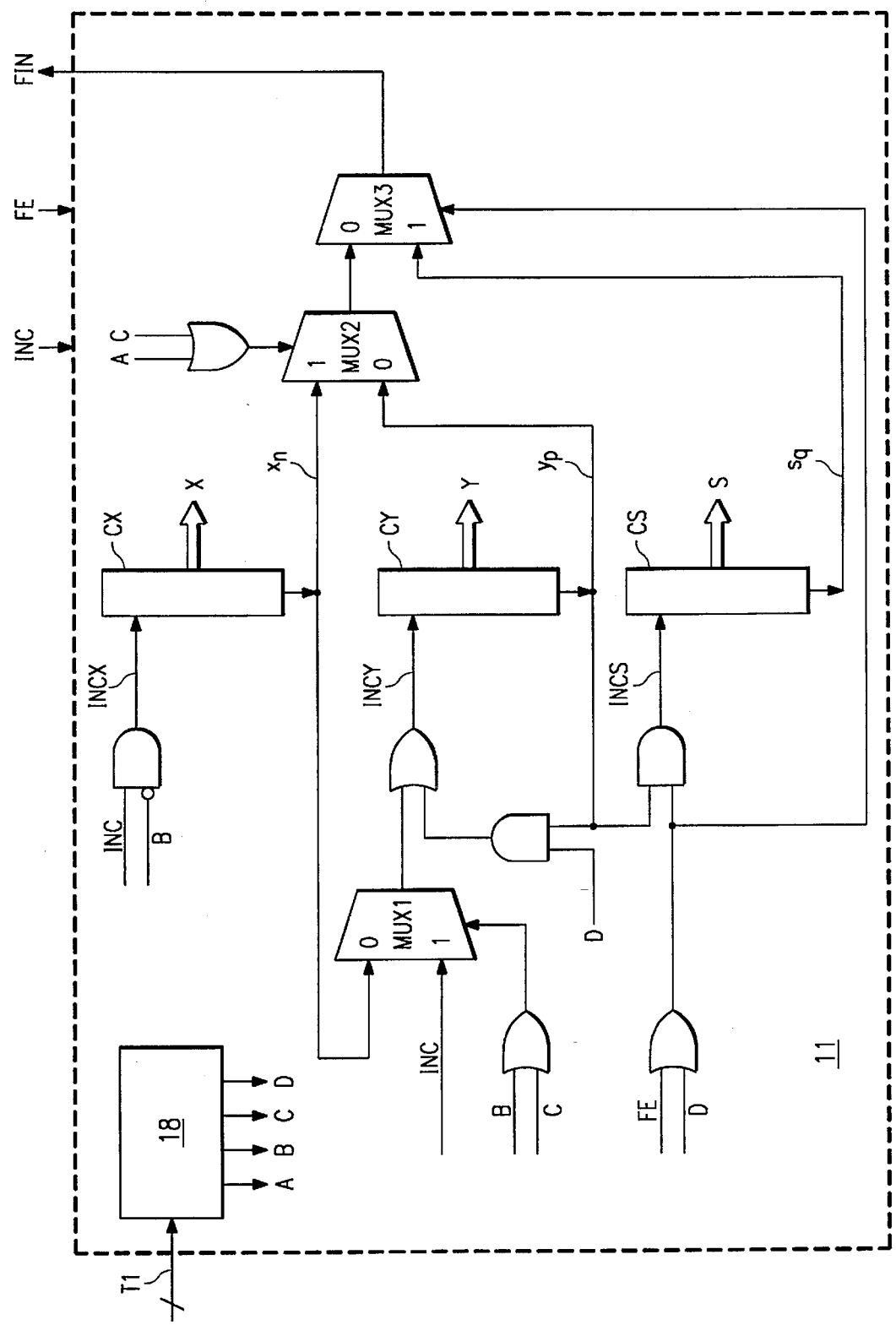
FIG. 2 shows an embodiment of the address generator.

FIG. 2 shows an embodiment of an address generator 11 that can be used to carry out several types of test. According to the example described, the first test word T1 is formed by two bits enabling four different test modes to be defined. The word T1 is received by a decoder 18 giving, at output, four test mode signals A, B, C, D corresponding respectively to the programming of the first column, the first row, the diagonal of a single sector and the diagonal of all the sectors with a shift from one sector to another.

The generator furthermore has row counters CX, column counters CY and sector counters CS respectively giving the internal row addresses X, column addresses Y and sector addresses S. The addresses X, Y, S are formed respectively by n, p, s bits, xn, yp, sq respectively designating the overflow signals of the corresponding counter. In the example given, n is assumed to be greater than p.

The generator receives the incrementation signal INC from the unit 2 and the signal FE to activate the total erasure of the memory from the control circuit 3. The counters CX, CY, CS respectively receive incrementation commands INCX, INCY, INCS given by a set of logic circuits controlled by the signals INC, A, B, C, D as well as the overflow signals xn and yp of the counters CX and CY. Other logic circuits give the end-of-count signal FIN as a function of the signals A, C and the overflow signals xn, yp, sq of the counters CX, CY, CS. The logic functions performed by these circuits may be summarized by the following logic equations:

$$INCX = INC \cdot B^*, \text{ with } B^* \text{ being the complement of } B \quad (1)$$

$$\text{if } B+C=1, INCY = xn + D \cdot yp \quad (2)$$

$$\text{if } B+C=1, INCY = INC + D \cdot yp \quad (3)$$

$$INCS = yp \cdot (FE+D) \quad (4)$$

$$\text{if } FE+D=1, FIN = sq \quad (5)$$

$$\text{if } A+C=1, FIN = xn \quad (6)$$

$$\text{if } A+C=0, FIN = yp \quad (7)$$

The generator 11 also receives clock signals (not shown) used to synchronize its operation, notably that of the counters, with the operation of the other units with which it exchanges signals.

The working of the address generator can easily be deduced from the drawing and from the formulae. In normal operation, the signals A, B, C, D are all at zero. If the total erasure control signal FE is inactive, the counter CX is incremented by the signal INC and the counter CY is incremented by the overflow signal xn of the counter CX. The overflow signal yp of the counter CX then gives the signal FIN. If the total erasure signal FE is active, the sector counter CS is incremented by the overflow signal yp and the overflow signal sq gives the signal FIN.

When the first test mode A is active, only the row counter CX is incremented and its overflow signal xn gives the end-of-count signal FIN. According to the second test mode, the signal B is active. This means that only the column counter CY is incremented and its overflow signal yp gives the end-of-count signal FIN. According to the third test mode, C is active and the counters CX and CY are incremented simultaneously. Since it has been assumed that n is greater than p, the end-of-count signal FIN is given by the overflow signal xn. According to the fourth test mode, the signal D is active and, as above, the counters CX and CY are incremented simultaneously. The overflow yp of the counter CY prompts the incrementation of the sector counter CS as well as an incrementation of the column counter CY so as to prompt a shifting of the diagonal when going from one sector to the next one. The end-of-count signal FIN is given by the overflow signal sq of the counter CS.

Figure 3:
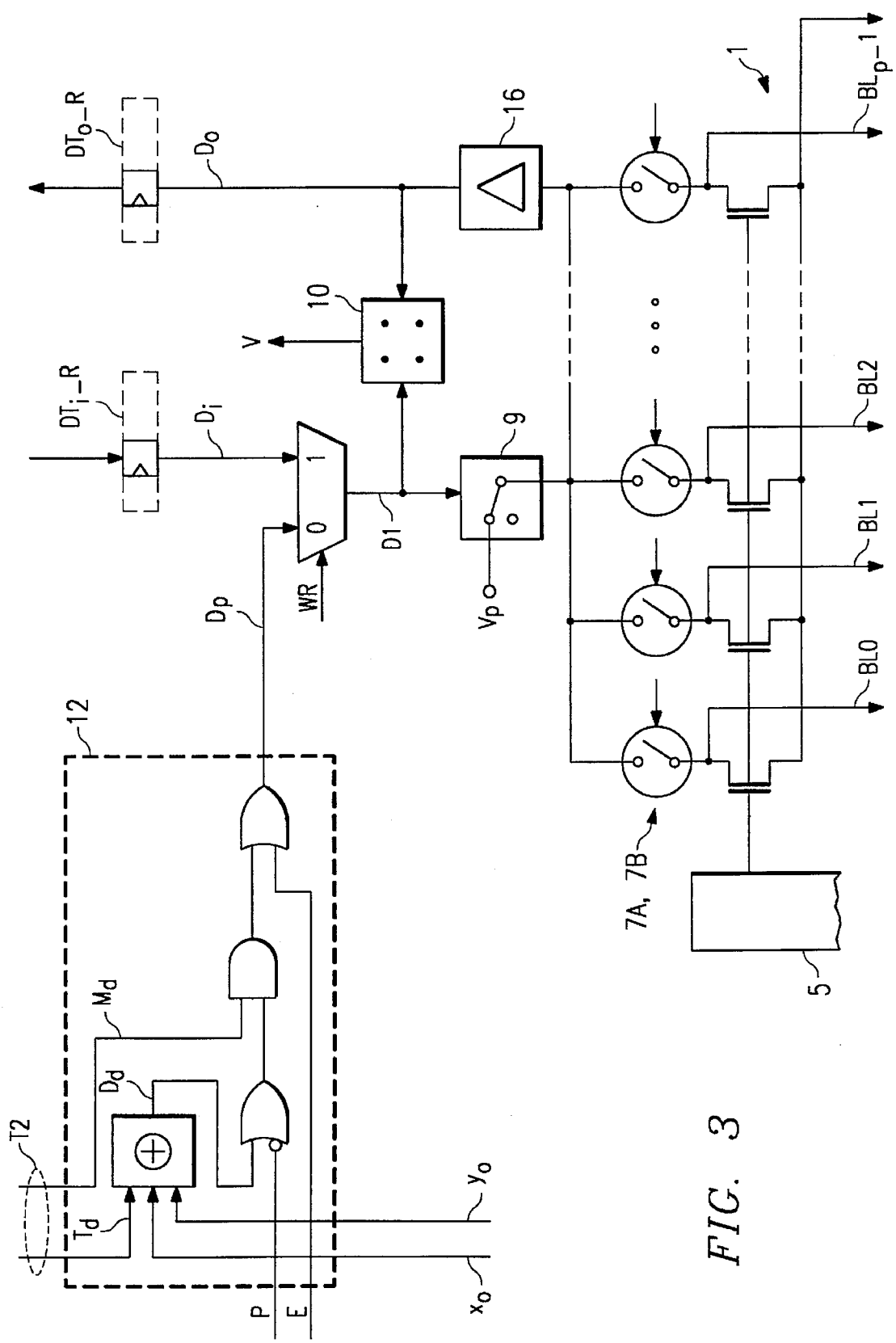
FIG. 3 shows the data generator in relation with the read and write circuits of the cells.

FIG. 3 shows an exemplary embodiment of the data generator 12 linked with the read and write circuits of the cells of the memory. To simplify the drawing, the only circuits shown are those relating to one data bit only. The example of a memory organized in words of several bits can easily be deduced from this drawing by providing for several parallel-connected circuits associated respectively with the different bits forming each word.

The figure shows a part of a matrix 1 using floating-gate MOS transistors as memory cells. A row is then formed by several transistors having their sources connected to one another and supplied by the supply circuit of the sources 6 (not shown). Similarly, the gates of a row are supplied in parallel by means of the selection circuit 5 using the supply circuit of the gates 6 (not shown). The transistors of one and the same column have their drains connected to each other by bit lines BL0, BL1, . . . , BLp-1. The bit lines are connected to the reading means 16 and to the drain supply circuit 9 by means of column selection circuits 7A, 7B controlled by the columns and sector decoders as a function respectively of the column and sector addresses. The supply circuit 9 applies the programming voltage of the drains Vp in response to the programming control signal D1 given by the data selector 8. The selector 8 is a two-input multiplexer connected respectively to the output Dp of the data generator 12 and to the output Di of one of the flip-flop circuits of the input data register DTi-R. The multiplexer 8 is controlled by the write control signal WR coming from the control circuit 3. The output of the amplification means 16 is connected to the input Do of one of the flip-flop circuits of the output data register DTo-R as well as to an input of the comparator 10 whose second input is connected to the output D1 of the multiplexer 8.

The data generator 12 receives the second test word T2 from the test circuit 15, the programming and erasure commands P, E from the unit 2 and the least significant bits x0, y0 of the internal row and column addresses X, Y from the address generator 11. As an example, the test word T2 is formed by only two bits Td, Md designed to control the formation of checkerboards. More specifically, the circuit described fulfills the following logic function:

$$Dp = E + Md \cdot P^* + Md \cdot Dd$$

where P* is the complement of P, and $$Dd = x0 \oplus y0 \oplus Td.$$

The circuit of FIG. 3 works as follows. In response to a read command, the amplification means 16 are activated and the flip-flop circuit of the register DTo-R is loaded with its output signal. In response to an external command for writing the word loaded in the register DTi-R, the multiplexer 8 is positioned so as to control the supply circuit 9 by the output signal of the corresponding flip-flop circuit of this register. For the other operations (pre-erasure programming algorithm, erasure algorithm and tests), the multiplexer 8 is positioned to control the circuit 9 by the output signal Dp of the data generator. Thus, in accordance with the foregoing logic equation, it is possible to have the following cases. During an erasure or a pre-erasure programming operation, the test bits Td and Md are at zero. The result thereof is that Dp takes the value 1 during the erasure (E=1) and takes the value 0 during the pre-erasure programming (P=1 and E=0). The test modes are activated as for a pre-erasure programming (P=1, E=0) by forcing Md to 1. According to a first test mode (Td=0), Dd takes the value 1 when the addresses X and Y have different parities. According to a second test mode (Td=1), Dd takes the value 1 when X and Y have the same parity. In both cases, we have Dp=Dd.

Thus, the programming in a checkerboard pattern will be done by giving the second test word T2 the values indicated here above and by activating the pre-erasure programming algorithm, the address generator being kept in one of its normal modes of operation.

In the foregoing description, it can be realized that the implementation of the tests requires very few modifications and additional circuits as compared with a standard memory. In particular, no change needs to be made to the algorithms programmed in the unit 2.

Naturally, the invention is not limited to the particular embodiments that have just been described. Those skilled in the art could easily design many variants of the address and data generators to obtain other configurations. All that is needed for this is to make the counter incrementation signals and the value Dp depend on additional test signals as well as on the values of the internal addresses X, Y, S, according to any functions.

MODIFICATIONS AND VARIATIONS

As will be recognized by those skilled in the art, the innovative concepts described in the present application can be modified and varied over a tremendous range of applications, and accordingly the scope of patented subject matter is not limited by any of the specific exemplary teachings given. For example, as will be obvious to those of ordinary skill in the art, other circuit elements can be added to, or substituted into, the specific circuit topologies shown.

What is claimed is:

1. A non-volatile memory that is electrically modifiable by erasing and programming operations, said memory comprising:

at least one matrix of memory cells organized in rows and columns, supply means to apply erasure and programming voltages to said rows and columns, said programming voltages being applied selectively to the rows and columns identified respectively by row addresses and column addresses, an address generator comprising counting means activated by an incrementation signal, means to control said supply means and said address generator, said erasure operation consisting of the performance, by said control means, of a first pre-erasure programming algorithm followed by a second erasure algorithm, said first algorithm consisting in activating the incrementation of said counting means to successively give all the possible values of said row addresses and column addresses and, for each address value given, in activating said supply means to give said programming voltages, said second erasure algorithm consisting in activating the incrementation of said counting means to successively give all the possible values of said row addresses and column addresses and, for each address value given, verifying that the cell at such address corresponds to an erased reference cell, and applying an erasure voltage if the cell at such address does not correspond to said erased reference cell, said memory being one wherein said counting means comprise a row counter and a column counter respectively giving said row address and column address values, and wherein said address generator is designed to work according to a normal mode and at least one test mode, the operation in test mode(s) being conditioned by a first test word, said normal mode consisting in incrementing said row counter exclusively by said incrementation signal and said column counter exclusively by an overflow signal of said row counter, said test mode or modes consisting in permitting the incrementation, by said incrementation signal, of said row counter and/or the incrementation of said column counter as a function of said first test word.

2. A memory according to claim 1, wherein a first test mode consists in incrementing exclusively said row counter by said incrementation signal.

3. A memory according to claim 1, wherein a second test mode consists in incrementing exclusively said column counter by said incrementation signal.

4. A memory according to claim 1, wherein a third test mode consists in incrementing said column and row counters simultaneously by said incrementation signal.

5. A memory according to claim 1, comprising several matrices of memory cells each defining a sector that can be selected by a sector address, wherein said counting means comprise a sector counter and wherein a fourth test mode consists in simultaneously incrementing said row and column counters by said incrementation signal and in activating the incrementation of said sector counter by a signal relating to the overflow of said column counter.

6. A memory according to claim 5, wherein said overflow signal of said column counter activates the incrementation of said column counter when the address generator works according to said fourth test mode.

7. A memory according to claim 1, wherein said control means comprise at least one data generator which can be placed in a first state or a second state and which, during the performance of said first algorithm, controls said supply means to apply said programming voltages provided that said data generator is in said first state, and wherein said data generator is designed to work according to a normal mode or at least one test mode, the operation in test mode being conditioned by a second test word, said operation in normal mode consisting in placing said data generator in said first state, the operation in test mode consisting in placing said data generator in said second state as a function of said second test word and of the address given by said data generator.

8. A memory according to claim 7, characterized in that a fifth test mode consists in making said address generator work according to its normal mode and setting said data generator in said first state when the values contained in said row and column counters have the same parity.

9. A memory according to claim 7, characterized in that a sixth test mode consists in making said address generator work according to its normal mode and setting said data generator in said first state when the values contained in said row and column counters have opposite parities.

10. An integrated circuit containing a memory according to claim 1, as well as a test circuit designed to give test words in response to test commands external to said integrated circuit.

* * * * *